United States Patent
Jang et al.

(10) Patent No.: US 9,617,635 B2
(45) Date of Patent: Apr. 11, 2017

(54) VAPOR DEPOSITION APPARATUS

(71) Applicant: Samsung Display Co., Ltd., Yongin, Gyeonggi-Do (KR)

(72) Inventors: Cheol Jang, Yongin (KR); Seung-Hun Kim, Yongin (KR); Seung-Yong Song, Yongin (KR); Jin-Kwang Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 640 days.

(21) Appl. No.: 13/843,801

(22) Filed: Mar. 15, 2013

(65) Prior Publication Data

US 2014/0123899 A1    May 8, 2014

(30) Foreign Application Priority Data

Nov. 7, 2012    (KR) .......................... 10-2012-0125705

(51) Int. Cl.
*C23C 16/50*    (2006.01)
*C23C 16/452*    (2006.01)
(Continued)

(52) U.S. Cl.
CPC ...... *C23C 16/452* (2013.01); *C23C 16/45519* (2013.01); *C23C 16/45536* (2013.01);
(Continued)

(58) Field of Classification Search
CPC ........ C23C 16/45551; C23C 16/45519; C23C 16/452; C23C 16/45576; H01J 37/32541; H01J 37/32532
See application file for complete search history.

(56) References Cited

U.S. PATENT DOCUMENTS 5,565,036 A * 10/1996 Westendorp ............ C23C 16/50
118/723 E
5,669,976 A * 9/1997 Yuuki ................... C23C 16/455
118/715
(Continued)

FOREIGN PATENT DOCUMENTS

EP    0 716 440 A1    6/1996
JP    07-197806    8/1995
(Continued)

OTHER PUBLICATIONS

Office Action issued in Korean Patent Application No. 10-2012-0125705 dated Jun. 20, 2013, 6 pages.
(Continued)

*Primary Examiner* — Gordon R Baldwin
*Assistant Examiner* — Aiden Lee
(74) *Attorney, Agent, or Firm* — Lewis Roca Rothgerber Christie LLP

(57) ABSTRACT

A vapor deposition apparatus including a first region including a first injection unit configured to inject a first raw material, and a second region including a second injection unit configured to inject a second raw material, wherein the second injection unit includes a plasma generation unit, wherein the plasma generation unit includes a plasma generator, a corresponding surface surrounding the plasma generator, and a plasma generation space between the plasma generator and the corresponding surface, and wherein the plasma generator has a groove in a lengthwise direction of the plasma generator.

12 Claims, 5 Drawing Sheets

(51) Int. Cl.
*C23C 16/455* (2006.01)
*C23C 16/54* (2006.01)
*H01J 37/32* (2006.01)

(52) U.S. Cl.
CPC ........ *C23C 16/45551* (2013.01); *C23C 16/54* (2013.01); *H01J 37/3244* (2013.01)

(56) References Cited

U.S. PATENT DOCUMENTS

| | | | | |
|---|---|---|---|---|
| 5,711,814 | A | * | 1/1998 | Mori ..................... C23C 16/503 118/723 E |
| 5,820,947 | A | | 10/1998 | Itoh |
| 5,961,726 | A | * | 10/1999 | Aoike ............... H01J 37/32082 118/723 E |
| 6,500,315 | B1 | * | 12/2002 | Arunachalam ....... C23C 14/352 118/723 AN |
| 7,378,618 | B1 | * | 5/2008 | Sorabji ................... C30B 31/14 118/50.1 |
| 8,758,512 | B2 | | 6/2014 | Lee |
| 2011/0083809 | A1 | * | 4/2011 | de la Llera ....... H01J 37/32091 156/345.34 |
| 2012/0094149 | A1 | * | 4/2012 | Lee ....................... C23C 16/403 428/701 |

FOREIGN PATENT DOCUMENTS

| | | |
|---|---|---|
| JP | 7-316824 | 12/1995 |
| KR | 1996-0023995 | 7/1996 |
| KR | 10-2007-0119186 A | 12/2007 |
| KR | 10-2012-0027399 | 3/2012 |
| KR | 10-2012-0068184 A | 6/2012 |
| WO | WO 2012/054323 A1 | 4/2012 |
| WO | WO 2012/071195 A1 | 5/2012 |

OTHER PUBLICATIONS

Korean Registration Determination Certificate dated Dec. 26, 2014 of the corresponding Korean Patent Application No. 10-2012-0125705, noting listed references in this IDS (6 pages).

\* cited by examiner

VAPOR DEPOSITION APPARATUS

CROSS-REFERENCE TO RELATED PATENT APPLICATION

This application claims priority to and the benefit of Korean Patent Application No. 10-2012-0125705, filed on Nov. 7, 2012, in the Korean Intellectual Property Office, the disclosure of which is incorporated herein in its entirety by reference.

BACKGROUND

1. Field

Embodiments of the present invention relate to vapor deposition apparatuses.

2. Description of the Related Art

Semiconductor devices, display devices, and other electronic devices include a plurality of thin films. These thin films are formed using various methods, one of which is a vapor deposition method. According to a vapor deposition method, one or more gases are used as a raw material(s) to form thin films. Examples of the vapor deposition method include chemical vapor deposition (CVD), atomic layer deposition (ALD), and the like. In ALD, a raw material is injected (e.g., deposited) onto a substrate, and is then purged and pumped to absorb one or more molecular layers to the substrate, and then another raw material is injected onto the substrate using plasma, and is then purged and pumped to finally form one or more atomic layers.

The plasma is formed by applying a voltage between a first electrode with a pipe shape and a second electrode with a cylinder shape that is located outside the first electrode, and by applying a gas between the first and second electrodes. In the related art, the first electrode is formed of a material such as, for example, steel use stainless (SUS) with high stiffness, to minimize damage caused by plasma.

However, since a material having high stiffness, such as SUS, generally has high resistance, and thus generates much heat, and also has a slow rate of releasing heat, the temperature of an electrode is saturated, and thus it takes long to stabilize a voltage and a current, resulting in a reduction of yield. Moreover, the electrode may be thermally deformed due to a high temperature, and the accompanying ionization of a reaction gas is locally accelerated to generate arc discharge, resulting in a degradation of the uniformity of plasma.

SUMMARY

Embodiments of the present invention provide a vapor deposition apparatus that allows for increased yield, and that generates more uniform plasma.

According to an aspect of embodiments of the present invention, there is provided a vapor deposition apparatus including a first region including a first injection unit configured to inject a first raw material, and a second region including a second injection unit configured to inject a second raw material, wherein the second injection unit includes a plasma generation unit, wherein the plasma generation unit includes a plasma generator, a corresponding surface surrounding the plasma generator, and a plasma generation space between the plasma generator and the corresponding surface, and wherein the plasma generator has a groove in a lengthwise direction of the plasma generator.

The plasma generation unit may have an inflow unit configured to receive the second raw material injected into the plasma generation space, and a discharge unit configured to discharge the second raw material converted to a radical form in the plasma generation space, and the groove may face the inflow unit or the discharge unit.

The groove may include a first groove and a second groove that are parallel to each other, and the plasma generator may include a heat dissipating plate between the first groove and the second groove.

The groove may include a first groove and a second groove that are parallel to each other, and a plurality of heat dissipating fins spaced from each other in a lengthwise direction of the plasma generator may be between the first groove and the second groove.

The plasma generator may include a core unit in a center of the plasma generator, and an outer circumferential unit at least partially surrounding the core unit.

Thermal conductivity and electrical conductivity of the core unit may be respectively higher than thermal conductivity and electrical conductivity of the outer circumferential unit.

The groove may be at least partially defined by the outer circumferential unit and a part of the core unit.

The discharge unit may be configured to pass the second raw material in a radical therethrough, and may have a plurality of slits.

The first region may further include a first purge unit configured to inject a purge gas, a first pumping unit configured to pump between the first injection unit and the first purge unit, and a first curtain unit between the first purge unit and the second injection unit of the second region.

The second region may further include a second purge unit configured to inject a purge gas, a second pumping unit configured to pump between the second injection unit and the second purge unit, and a second curtain unit, and the second purge unit may be between the second pumping unit and the second curtain unit.

According to another aspect of embodiments of the present invention, there is provided a vapor deposition apparatus including a plurality of first regions each including a first injection unit configured to inject a first raw material, a first purge unit configured to inject a purge gas, and a first pumping unit configured to pump between the first injection unit and the first purge unit, and a plurality of second regions each including a second injection unit configured to inject a second raw material, a second purge unit configured to inject a purge gas, and a second pumping unit configured to pump between the second injection unit and the second purge unit, wherein the second injection unit includes a plasma generation unit, wherein the plasma generation unit includes a plasma generator, a corresponding surface surrounding the plasma generator, and a plasma generation space between the plasma generator and the corresponding surface, and wherein the plasma generator has a groove in a lengthwise direction of the plasma generator.

The plasma generation unit may further include an inflow unit configured to pass the second raw material to the plasma generation space, and a discharge unit configured to discharge a second raw material in a radical form generated in the plasma generation space, and the groove may face the inflow unit or the discharge unit.

The groove may include a first groove and a second groove parallel to each other, and the plasma generator may include a heat dissipating plate between the first groove and the second groove.

The groove may include a first groove and a second groove parallel to each other, and the plasma generator may have a plurality of penetration grooves in a lengthwise direction of the plasma generator adjoining the first groove and the second groove.

The plasma generator may include a core unit in a center of the plasma generator, and an outer circumferential unit at least partially surrounding the core unit.

Thermal conductivity and electrical conductivity of the core unit may be respectively higher than thermal conductivity and electrical conductivity of the outer circumferential unit.

The groove may be at least partially defined by the outer circumferential unit and the core unit.

The discharge unit may be configured to pass the second raw material in a radical form therethrough, and has a plurality of slits.

The vapor deposition apparatus may further include a first curtain unit between respective ones of the first purge unit of each of the first regions and the second injection unit of each of the second regions, and a second curtain unit between respective ones of the second purge unit of each of the second regions and the first injection unit of each of the first regions.

The plurality of first regions may alternate with the plurality of second regions.

BRIEF DESCRIPTION OF THE DRAWINGS

The above and other aspects of embodiments of the present invention will become more apparent by describing in detail exemplary embodiments thereof with reference to the attached drawings in which.

DETAILED DESCRIPTION

Figure 1:
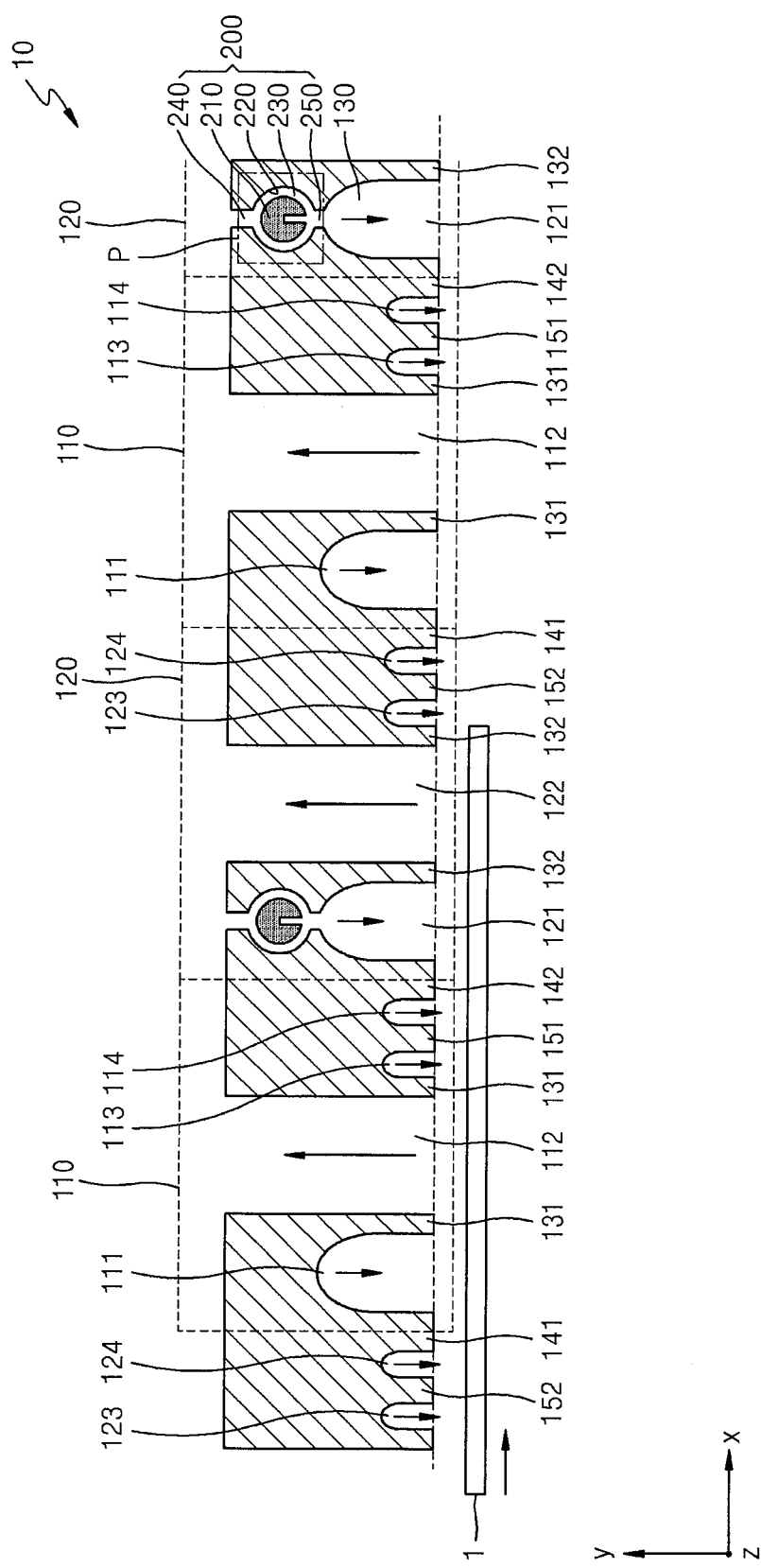
FIG. 1 is a schematic cross-section of a vapor deposition apparatus according to an embodiment of the present invention.

As embodiments of the present invention allow for various changes, particular embodiments will be illustrated in the drawings, and described in detail in the written description. However, this is not intended to limit the present invention to particular modes of practice, and it is to be appreciated that all changes, equivalents, and substitutes that do not depart from the spirit and technical scope of the present invention are encompassed in the present invention.

In the following description of embodiments of the present invention, a detailed description of disclosed technology will not be provided if deemed to make features of embodiments of the invention obscure.

While terms such as "first," "second," etc., may be used to describe various components, such components must not be limited to the above terms. The above terms are used only to distinguish one component from another.

The terms used in the present specification are merely used to describe particular embodiments, and are not intended to limit the present invention. An expression used in the singular encompasses the expression in the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Hereinafter, embodiments of the present invention will be described more fully with reference to the accompanying drawings, in which exemplary embodiments of the invention are shown.

Figure 2:
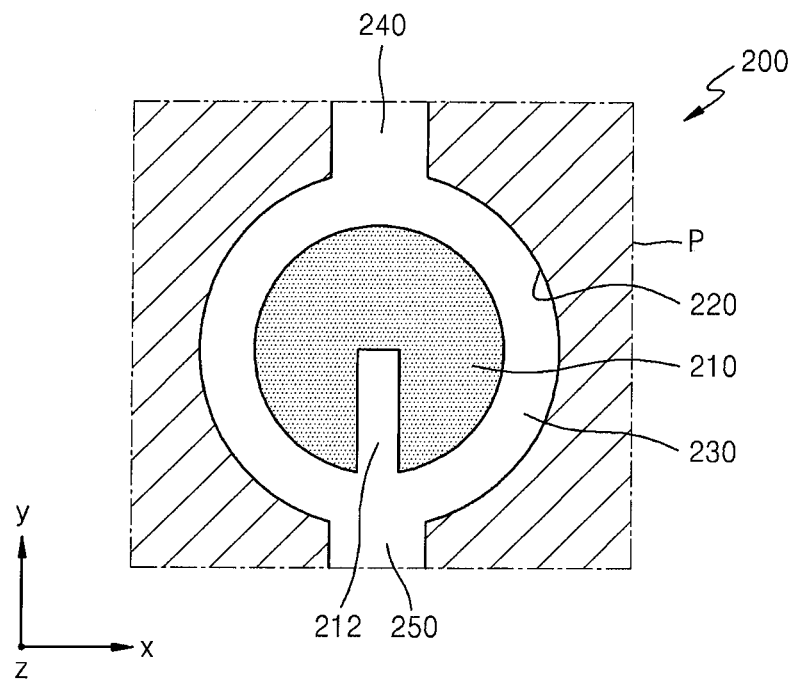
FIG. 2 is a magnified cross-section (shown as area P in FIG. 1) of a plasma generation unit of the vapor deposition apparatus of the embodiment shown in FIG. 1.
Figure 3:
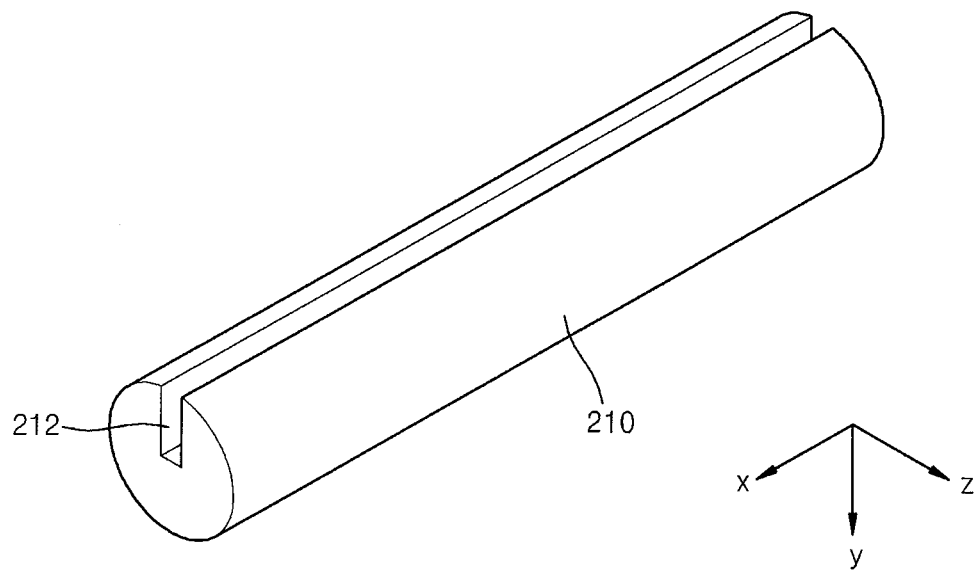
FIG. 3 is a perspective view of a plasma generator of the plasma generation unit of the vapor deposition apparatus of the embodiment shown in FIG. 1.
Figure 4:
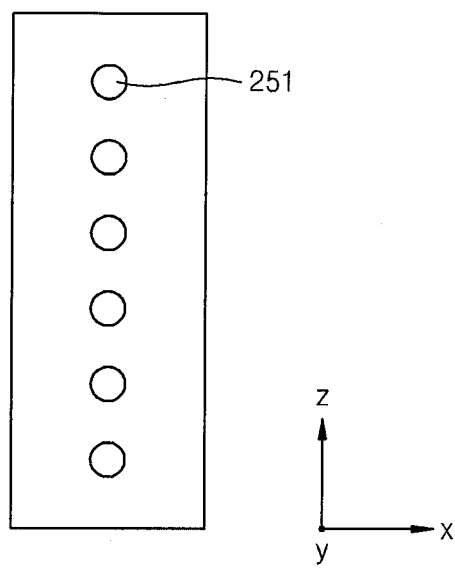
FIG. 4 illustrates slits of the vapor deposition apparatus of the embodiment shown in FIG. 1, according to an embodiment of the present invention.

FIG. 1 is a schematic cross-section of a vapor deposition apparatus 10 according to an embodiment of the present invention, FIG. 2 is a magnified cross-section of a portion P of the vapor deposition apparatus 10 of FIG. 1, FIG. 3 is a perspective view of a plasma generator 210 of the vapor deposition apparatus 10 of FIG. 1, and FIG. 4 illustrates a plurality of slits 251 (e.g., of a discharge unit/discharge space) of the vapor deposition apparatus 10 of FIG. 1, according to an embodiment of the present invention.

Referring to FIG. 1, the vapor deposition apparatus 10 according to the current embodiment includes a first region 110 and a second region 120. A plurality of the first regions 110 and a plurality of the second regions 120 may be arranged, and the first regions 110 may alternate with the second regions 120.

A substrate 1 is positioned below the vapor deposition apparatus 10 and moves relative to the vapor deposition apparatus 10 to sequentially pass by/under the first regions 110 and the second regions 120. For example, the substrate 1 may move in a direction X, and a desired thin film may be formed on the substrate 1 using the vapor deposition apparatus 10.

Each of the first regions 110 may include a first injection unit 111, a first pumping unit 112, a first purge unit 113, and a first curtain unit 114.

The first injection unit 111 injects a first raw material for deposition. In detail, the first injection unit 111 injects a first raw material in a gas state in a direction toward the substrate 1.

The first purge unit 113 injects (e.g., ejects) a purge gas in the direction toward the substrate 1. The first purge unit 113 injects a gas that does not affect deposition, for example, an argon gas or a nitrogen gas, in the direction toward the substrate 1.

The first pumping unit 112 is located between the first injection unit 111 and the first purge unit 113, and pumps (e.g., by creating suction) a physical absorption layer separated from the substrate 1 by the purge gas, in a direction indicated by an arrow of FIG. 1.

The first curtain unit 114 is formed adjacent a second region 120, and injects a curtain gas, which may be an inert gas that does not affect a deposition process. The first curtain unit 114 is formed adjacent the second region 120 to block a material generated in, or injected by, the first region 110 from entering into the second region 120 during a deposition process, and to block a material generated in, or injected by, the second region 120 from entering into the first region 110.

A first barrier A 131 is formed to separate the first pumping unit 112 and the first injection unit 111 adjacent each other, and to separate the first pumping unit 112 and the first purge unit 113 adjacent each other. In other words, the first pumping unit 112 and the first injection unit 111 do not share any region, and the first pumping unit 112 and the first purge unit 113 do not share any region.

A second barrier A 141 may be formed between the first injection unit 111 and another gas injection unit adjacent to the first injection unit 111, for example, a second curtain unit 124 located to the left of the first region 110, to separate the first injection unit 111 and the second curtain unit 124. A third barrier A 151 may be formed between the first purge unit 113 and the first curtain unit 114 adjacent each other to separate the first purge unit 113 and the first curtain unit 114.

Each of the second regions 120 may include a second injection unit 121, a second pumping unit 122, a second purge unit 123, and a second curtain unit 124.

The second injection unit 121 injects a second raw material for deposition, and includes a plasma generation unit 200 for generating plasma.

Referring to FIG. 2, which is a magnified view of the plasma generation unit 200, which includes a plasma generator 210, a corresponding surface 220, and a plasma generation space 230 formed between the plasma generator 210 and the corresponding surface 220. The plasma generation unit 200 may further include an inflow unit 240 for injecting a second raw material into the plasma generation space 230, and a discharge unit 250 for discharging the second raw material in a radical form generated in the plasma generation space 230.

The plasma generator 210 may be an electrode to which a voltage is applied. The corresponding surface 220 may formed to surround the plasma generator 210, and may be a grounded electrode. However, the present invention is not limited thereto, for example, the plasma generator 210 may be grounded, and a voltage may be applied to the corresponding surface 220.

A groove 212 is formed on one side of the plasma generator 210. In more detail, as illustrated in FIG. 3, the groove 212 may be formed in the lengthwise direction of the plasma generator 210.

When the groove 212 is formed on the plasma generator 210, the surface area of the plasma generator 210 increases, and thus heat emission (e.g., dissipation) efficiency may improve. Consequently, even when the plasma generator 210 continuously generates heat when generating plasma, a saturation temperature of the plasma generator 210 decreases due to efficient heat emission.

In general, since metal has the property that resistance increases with an increase in temperature, if the saturation temperature that the plasma generator 210 reaches decreases, a resistance change of the plasma generator 210 due to an increase in temperature may be reduced or minimized, and thus the time required to stabilize the voltage characteristics of the plasma generator 210 may be decreased, allowing for an improvement in the yield of the vapor deposition apparatus 10.

In more detail, the resistance of the plasma generator 210 varies due to heat emission, and accordingly the voltage of the plasma generator 210 changes. Consequently, when a deposition process is conducted before the temperature of the plasma generator 210 is the saturation temperature namely, before the voltage of the plasma generator 210 is stabilized, the characteristics of a thin film formed in the early part of the deposition process may be different from those of a thin film formed while the temperature of the plasma generator 210 is increasing or different. Accordingly, the deposition process needs to be conducted after the stabilization of the voltage characteristics of the plasma generator 210 to make the characteristics of thin films more uniform. According to embodiments of the present invention, the time required for the stabilization is reduced, and thus the yield of the vapor deposition apparatus 10 may improve.

Moreover, if the saturation temperature of the plasma generator 210 decreases, thermal deformation of the plasma generator 210 is reduced or prevented, and thus arc discharge may be reduced or prevented from occurring due to relatively fast local progress of ionization of a reaction gas. A voltage and a current applied to the plasma generator 210 may be stabilized, thereby forming more uniform plasma.

For example, plasma may be formed by applying a pulse voltage to the plasma generator 210 to generate a potential difference between the plasma generator 210 and the corresponding surface 220, which surrounds the plasma generator 210, and introducing a reaction gas into the plasma generation space 230. Thus, since a portion of the plasma generation unit 200 where the discharge unit 250 is formed is not used in plasma discharge, the groove 212 may be formed opposite to the discharge unit 250 so as to not affect plasma discharge.

In the plasma generation space 230, the second raw material passes through the plasma and acquires a radical form. The second raw material in a radical form is transmitted in the direction toward the substrate 1 via the discharge unit 250. For example, the discharge unit 250 may be formed so that the second raw material in a radical form passes therethrough, and may have the slits 251, which are arranged in one direction.

Referring to FIG. 4, which illustrates the slits 251 of the vapor deposition apparatus 10, the slits 251 may be arranged at regular intervals in the lengthwise direction of the plasma generator 210. The second raw material in a radical form, which is generated in the plasma generation space 230, may be uniformly supplied onto the substrate 1 via the slits 251, and may be supplied without locally concentrating on the second injection unit 121. Although the slits 251 are circles having the same sizes in the embodiment shown in FIG. 4, the present invention is not limited thereto, and the slits 251 may have various other sizes and shapes.

Referring back to FIG. 1, the second purge unit 123 injects a purge gas in the direction toward the substrate 1. The gas may be a gas that does not affect deposition, for example, an argon gas or a nitrogen gas, in the direction toward the substrate 1.

The second pumping unit 122 is located between the second injection unit 121 and the second purge unit 123. After the second raw material is injected from the second injection unit 121 toward the substrate 1, the purge gas may be injected by the second purge unit 123 toward the substrate 1, and the purge gas may be pumped by the second pumping unit 122 to form a first layer containing the first raw material and the second raw material on the substrate 1.

The second curtain unit 124 is formed adjacent another first region 110 that is next to the second curtain unit 124 in a direction in which the substrate 1 moves. The second curtain unit 124 injects a curtain gas, and the curtain gas may be an inert gas that does not affect a deposition process.

According to the present embodiment, the substrate 1 and the vapor deposition apparatus 10 conduct a deposition process while moving relative to each other, and the second curtain unit 124 blocks a material generated in, or injected by, the second region 120 from mixing with a material generated in, or injected by, a first region 110 (located on the right side of the second region 120 in FIG. 1) during the deposition process.

A first barrier B 132 is formed to separate the second pumping unit 122 and the second injection unit 121 adjacent each other, and to separate the second pumping unit 122 and the second purge unit 123 adjacent each other. In other words, the second pumping unit 122 and the second injection unit 121 do not share any region, and the second pumping unit 122 and the second purge unit 123 do not share any region.

Similarly, a second barrier B 142 may be formed between the second injection unit 121 and another gas injection unit adjacent to the second injection unit 121, and a third barrier B 152 may be formed between the second purge unit 123 and the second curtain unit 124.

A deposition process performed by the above-described vapor deposition apparatus 10 will now be described briefly.

The substrate 1 moves in the direction X of FIG. 1 while under the vapor deposition apparatus 10. To this end, the substrate 1 may be mounted on a stage, and may be moved by a driving unit. Alternatively, the substrate 1 may move in the direction X, and/or the vapor deposition apparatus 10 may move in an opposite direction (–X.)

In the first region 110, a first raw material is injected by the first injection unit 111 in the direction toward the substrate 1. For example, the first raw material may be a gas containing aluminum (Al) atoms, such as trimethyl aluminum (TMA), but the present invention is not limited thereto.

A chemical absorption layer and a physical absorption layer are formed on an upper surface of the substrate 1 by the first raw material. The physical absorption layer, which has weak intermolecular coherence, is separated from the substrate 1 by the purge gas injected by the first purge unit 113, and is effectively removed from the substrate 1 via pumping of the first pumping unit 112. Therefore, a deposition film to be formed on the substrate 1 may have improved purity.

Since the first barriers A 131 are formed between the first pumping unit 112 and the first purge unit 113, and between the first pumping unit 112 and the first injection unit 111, the pumping of the first pumping unit 112 may be prevented from affecting the first injection unit 111 and the first purge unit 113.

The substrate 1 is moved from the first region 110 to the second region 120, and a second raw material is injected onto the substrate 1 by the second injection unit 121 of the second region 120. Since the first region 110 and the second region 120 are effectively separated from each other by the first curtain unit 114 of the first region 110, mixing of undesired materials in each operation of the deposition process is reduced or prevented.

The second injection unit 121 injects the second raw material in a radical form generated in the plasma generation space 230.

As described above, due to the formation of the groove 212 on the plasma generator 210, heat of the plasma generator 210 may be more efficiently discharged outside. Accordingly, by decreasing the saturation temperature that the plasma generator 210 reaches the time required to stabilize the voltage of the plasma generator 210 is reduced, and thus the yield of the vapor deposition apparatus 10 may increase. Moreover, more uniform plasma may be formed by reducing or preventing thermal deformation of the plasma generator 210, and a more uniform thin film having little to no variations in characteristics, even when the deposition process continues, may be formed.

The second raw material may include, for example, an oxygen radical, which may be formed by injecting $H_2O$, $O_2$, $N_2O$, or the like into the plasma generation space 230. The second raw material reacts with the chemical absorption layer formed of the first raw material having already absorbed to (e.g., been absorbed by) the substrate 1, or replaces a part of the chemical absorption layer, and a deposition layer such as, for example, an $Al_xO_y$ layer, is formed. At this time, an excess of the second raw material forms a physical absorption layer, and the physical absorption layer remains.

The second purge unit 123 injects a purge gas onto the substrate 1 to separate the remaining physical absorption layer from the upper surface of the substrate 1. The separated physical absorption layer is effectively removed from the substrate 1 via pumping of the second pumping unit 122, thereby forming a deposition layer with improved purity on the substrate 1. At this time, the pumping of the second pumping unit 122 does not affect the directionalities of the second raw material injected by the second injection unit 121, or of the purge gas injected by the second purge unit 123, due to the formation of the first barrier B 132. As such, while passing through the first region 110 and the second region 120, a desired single atomic layer is formed on the substrate 1.

Figure 5:
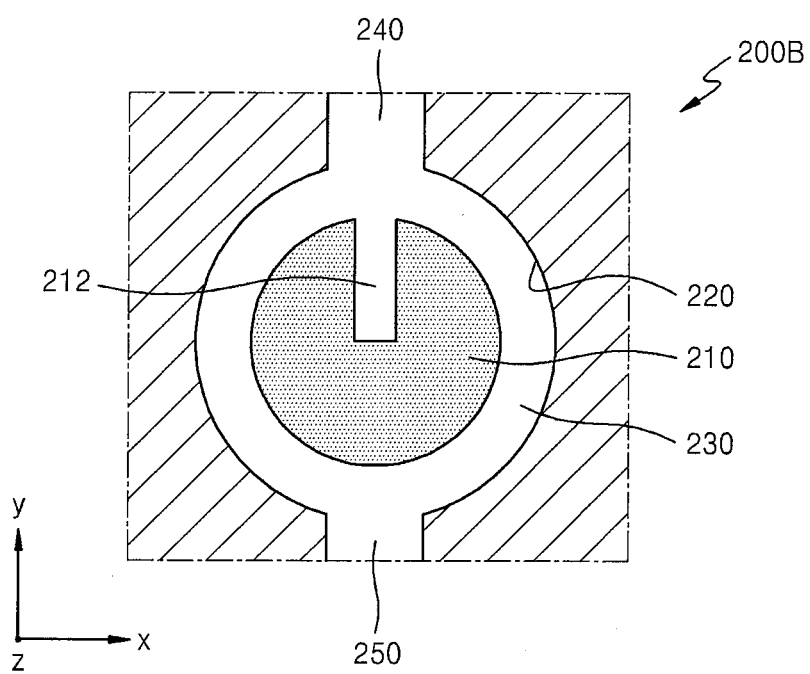
FIGS. 5 and 6 illustrate modified examples of the plasma generation unit of the vapor deposition apparatus of the embodiment shown in FIG. 1.
Figure 6:
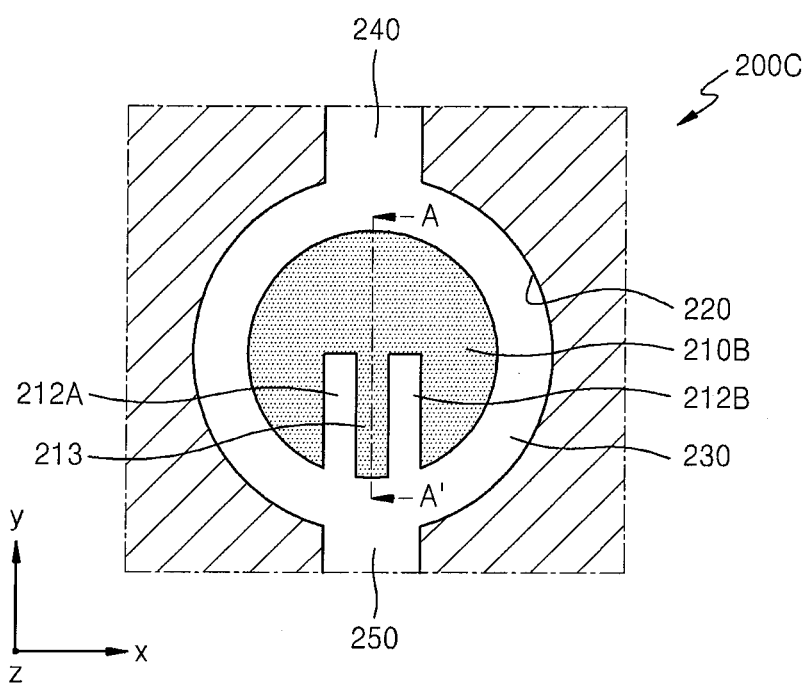

FIGS. 5 and 6 illustrate modified examples of the plasma generation unit 200 of the vapor deposition apparatus 10 of FIG. 1.

Since a plasma generation unit 200B of FIG. 5 and a plasma generation unit 200C of FIG. 6 are the modified examples of the plasma generation unit 200 of FIG. 2, only differences between the plasma generation unit 200 and each of the plasma generation units 200B and 200C will now be described.

First, the plasma generation unit 200B of FIG. 5 is different from the plasma generation unit 200 of FIG. 2 in that the groove 212 formed on the plasma generator 210 faces the inflow unit 240.

As described above, since plasma is generated between the plasma generator 210 and the corresponding surface 220, unlike the discharge unit 250, the inflow unit 240 is not used in plasma discharge. Accordingly, when the groove 212 is formed to face the inflow unit 240, the formation of the groove 212 does not affect plasma discharge. Since the inflow unit 240 has a relatively low temperature, when the groove 212 is formed to face the inflow unit 240, heat emission efficiency of the plasma generator 210 may improve.

Like the plasma generation unit 200 of FIG. 2, the plasma generation unit 200C of FIG. 6 includes a plasma generator 210B, a corresponding surface 220, and a plasma generation space 230 formed between the plasma generator 210B and the corresponding surface 220.

However, the plasma generation unit 200C of FIG. 6 is different from the plasma generation unit 200 of FIG. 2 in that the plasma generator 210B includes a first groove 212A and a second groove 212B, instead of the single groove 212 of the plasma generator 210 of FIG. 2.

Referring to FIG. 6, the first groove 212A and the second groove 212B are formed apart from each other, and extend in the lengthwise direction of the plasma generator 210B, and thus the plasma generator 210B includes a heat-dissipating plate 213 formed between (e.g., partially defining) the first groove 212A and the second groove 212B. Therefore, the surface area of the plasma generator 210B increases, leading to an improvement of heat emission efficiency.

Although the first groove 212A and the second groove 212B face the discharge unit 250 in FIG. 6, the present invention is not limited thereto, and the first groove 212A and the second groove 212B may face the inflow unit 240, like the plasma generation unit 200B of FIG. 5.

Although two grooves, namely, the first and second grooves 212A and 212B, and the single heat-dissipating plate 213 formed between the first and second grooves 212A and 212B are illustrated in FIG. 6, the present invention is not limited thereto. For example, the plasma generator 210B may include three or more grooves, and accordingly, two or more heat-dissipating plates may be included.

Figure 7:
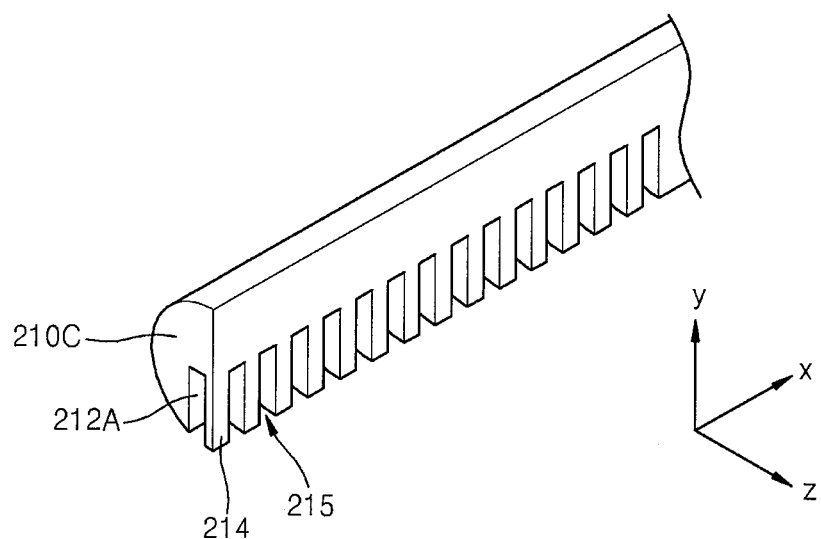
FIG. 7 is a perspective view of a plasma generator of the vapor deposition apparatus of the embodiment shown in FIG. 1, and taken along the line A-A' of FIG. 6, according to another embodiment of the present invention.

FIG. 7 is a perspective view of a plasma generator 210C of the vapor deposition apparatus 10 of FIG. 1, taken along the line A-A' of FIG. 6, according to another embodiment of the present invention.

Although a shape obtained by cutting the plasma generator 210B of FIG. 6 along the line A-A' of FIG. 6 is illustrated in FIG. 7 for convenience of explanation, the plasma generator 210C is different from the plasma generator 210B of FIG. 6.

The plasma generator 210C of FIG. 7 is different from the plasma generator 210 of FIG. 2 in that it includes the first groove 212A and the second groove 212B (instead of the single groove 212 of the plasma generator 210 of FIG. 2). In other words, since the plasma generator 210C of FIG. 7 is a modified example of the plasma generator 210 of FIG. 2, only differences therebetween will now be described.

Referring to FIG. 7, the first groove 212A and the second groove 212B are formed apart from each other, and extend in the lengthwise direction of the plasma generator 210C. The plasma generator 210C further includes a plurality of penetration grooves 215 that are arranged apart from each other in the lengthwise direction of the plasma generator 210C, and that adjoin the first groove 212A and the second groove 212B. Accordingly, a plurality of heat-dissipating fins 214 separate from each other in the lengthwise direction of the plasma generator 210C are formed between (e.g., partially define) the first groove 212A and the second groove 212B.

The heat-dissipating fins 214 effectively increase the surface area of the plasma generator 210C, thereby improving heat emission efficiency of the plasma generator 210C. The heat-dissipating fins 214 may be formed to face an inflow unit or a discharge unit of a plasma generation unit.

Figure 8:
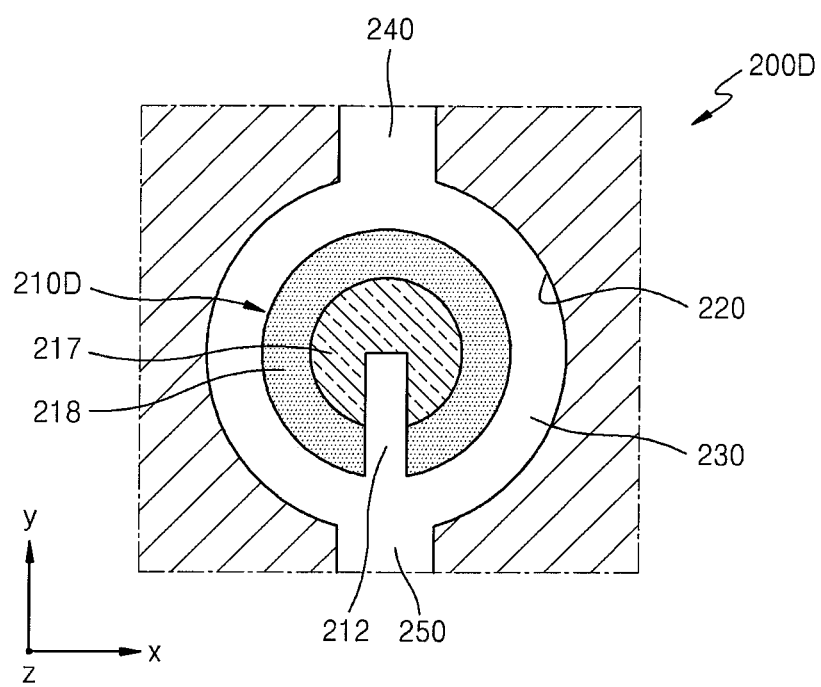
FIG. 8 is a cross-section of another modified example of the plasma generation unit of the vapor deposition apparatus of the embodiment shown in FIG. 1.

FIG. 8 is a cross-section of another modified example of the plasma generation unit 200 of the vapor deposition apparatus 10 of FIG. 1.

Since a plasma generation unit 200D of FIG. 8 is the modified example of the plasma generation unit 200 of FIG. 2, only differences therebetween will now be described.

Referring to FIG. 8, a plasma generator 210D includes a core unit 217 formed in the center, and an outer circumferential unit 218 formed on the outer surface of the core unit 217.

The core unit (e.g., inner core) 217 and the outer circumferential unit (e.g., outer core) 218 may be formed of different materials. However, the different materials used to form the core unit 217 and the outer circumferential unit 218 may allow thermal conductivity and electrical conductivity of the core unit 217 to be higher than those of the outer circumferential unit 218. For example, the core unit 217 may be formed of aluminum, copper, silver, or an alloy of these materials, and the outer circumferential unit 218 may be formed of a material having high strength and high durability, such as stainless steel or SUS, to protect the core unit 217 from plasma. However, the present invention is not limited thereto.

As such, when the plasma generator 210D includes the core unit 217 having high thermal conductivity and high electrical conductivity in its center, a rate of resistance increase of the plasma generator 210D may decrease even when the temperature of the plasma generator 210D increases.

The plasma generator 210D includes the groove 212 formed in the lengthwise direction of the plasma generator 210D. The groove 212 extends from the outer circumferential unit 218 to a part of the core unit 217 so as to expose the core unit 217. Accordingly, as the core unit 217, having high thermal conductivity, is exposed, the heat of the plasma generator 210D may be effectively discharged.

Since the groove 212 may be formed to face the discharge unit 250, plasma discharge is not interrupted by the groove 212, and a part of the core unit 217 exposed via the groove 212 may be prevented from being damaged by the plasma.

The groove 212 may be formed to face the inflow unit 240, as illustrated in FIG. 5, and/or two or more grooves may be formed, as illustrated in FIG. 6.

According to an embodiment of the present invention, heat emission efficiency of a plasma generator may improve to allow for an increase the yield of a vapor deposition apparatus, and more uniform plasma may be generated.

Since the components illustrated in the drawings are enlarged or downsized for convenience of explanation, the present invention is not restricted by the sizes or shapes of the components illustrated in the drawings. While embodiments of the present invention have been particularly shown and described with reference to exemplary embodiments thereof, it will be understood by those of ordinary skill in the art that various changes in form and details may be made therein without departing from the spirit and scope of the present invention as defined by the following claims, and their equivalents.

What is claimed is:

1. A vapor deposition apparatus comprising:
   a first region comprising a first injection unit configured to inject a first raw material; and
   a second region comprising a second injection unit configured to inject a second raw material,
   wherein the second injection unit comprises a plasma generation unit,
   wherein the plasma generation unit comprises:
      a plasma generator comprising:
         a core unit in a center of the plasma generator; and
         an outer circumferential unit at least partially surrounding the core unit;
      a corresponding surface surrounding the plasma generator; and
      a plasma generation space between the plasma generator and the corresponding surface, and
   wherein the plasma generator has a groove formed in the outer circumferential unit and extended into the core unit in a lengthwise direction of the plasma generator to expose an inner portion of the core unit.

2. The vapor deposition apparatus of claim 1, wherein the plasma generation unit has an inflow unit configured to receive the second raw material injected into the plasma generation space, and a discharge unit configured to discharge the second raw material converted to a radical form in the plasma generation space, and wherein the groove faces the inflow unit or the discharge unit.

3. The vapor deposition apparatus of claim 2, wherein the discharge unit is configured to pass the second raw material in a radical therethrough, and has a plurality of slits.

4. The vapor deposition apparatus of claim 1, wherein thermal conductivity and electrical conductivity of the core unit are respectively higher than thermal conductivity and electrical conductivity of the outer circumferential unit.

5. The vapor deposition apparatus of claim 1, wherein the first region further comprises:
   a first purge unit configured to inject a purge gas;
   a first pumping unit configured to pump between the first injection unit and the first purge unit; and
   a first curtain unit between the first purge unit and the second injection unit of the second region.

6. The vapor deposition apparatus of claim 1, wherein the second region further comprises:
   a second purge unit configured to inject a purge gas;
   a second pumping unit configured to pump between the second injection unit and the second purge unit; and
   a second curtain unit,
   wherein the second purge unit is between the second pumping unit and the second curtain unit.

7. A vapor deposition apparatus comprising:
   a plurality of first regions each comprising:
      a first injection unit configured to inject a first raw material;
      a first purge unit configured to inject a purge gas; and
      a first pumping unit configured to pump between the first injection unit and the first purge unit; and
   a plurality of second regions each comprising:
      a second injection unit configured to inject a second raw material;
      a second purge unit configured to inject a purge gas; and
      a second pumping unit configured to pump between the second injection unit and the second purge unit,
   wherein the second injection unit comprises a plasma generation unit,
   wherein the plasma generation unit comprises:
      a plasma generator comprising:
         a core unit in a center of the plasma generator; and
         an outer circumferential unit at least partially surrounding the core unit;
      a corresponding surface surrounding the plasma generator; and
      a plasma generation space between the plasma generator and the corresponding surface, and
   wherein the plasma generator has a groove formed in the outer circumferential unit and extended into the core unit in a lengthwise direction of the plasma generator to expose an inner portion of the core unit.

8. The vapor deposition apparatus of claim 7, wherein the plasma generation unit further comprises:
   an inflow unit configured to pass the second raw material to the plasma generation space; and
   a discharge unit configured to discharge a second raw material in a radical form generated in the plasma generation space, and
   wherein the groove faces the inflow unit or the discharge unit.

9. The vapor deposition apparatus of claim 8, wherein the discharge unit is configured to pass the second raw material in a radical form therethrough, and has a plurality of slits.

10. The vapor deposition apparatus of claim 7, wherein thermal conductivity and electrical conductivity of the core unit are respectively higher than thermal conductivity and electrical conductivity of the outer circumferential unit.

11. The vapor deposition apparatus of claim 7, further comprising:
   a first curtain unit between respective ones of the first purge unit of each of the first regions and the second injection unit of each of the second regions; and
   a second curtain unit between respective ones of the second purge unit of each of the second regions and the first injection unit of each of the first regions.

12. The vapor deposition apparatus of claim 7, wherein the plurality of first regions alternate with the plurality of second regions.

* * * * *